(12) United States Patent
Park et al.

(10) Patent No.: US 10,984,873 B2
(45) Date of Patent: Apr. 20, 2021

(54) MEMORY DEVICE FOR STABILIZING INTERNAL VOLTAGE AND METHOD OF STABILIZING INTERNAL VOLTAGE OF THE SAME

(71) Applicant: Samsung Electronics Co., Ltd., Suwon-si (KR)

(72) Inventors: Yongha Park, Incheon (KR); Chaehoon Kim, Suwon-si (KR); Sangwan Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/825,302

(22) Filed: Mar. 20, 2020

(65) Prior Publication Data

US 2020/0321059 A1 Oct. 8, 2020

(30) Foreign Application Priority Data

Apr. 4, 2019 (KR) .................. 10-2019-0039740

(51) Int. Cl.
*G11C 16/24* (2006.01)
*G11C 16/04* (2006.01)
*G11C 16/30* (2006.01)
*G11C 16/26* (2006.01)
*H01L 27/11582* (2017.01)
*H01L 27/11556* (2017.01)

(52) U.S. Cl.
CPC .......... *G11C 16/24* (2013.01); *G11C 16/0483* (2013.01); *G11C 16/26* (2013.01); *G11C 16/30* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 7,729,177 B2 | 6/2010 | Song et al. | |
| 7,872,925 B2 | 1/2011 | Lee et al. | |
| 8,531,901 B2 | 9/2013 | Ogiwara et al. | |
| 9,997,250 B2 | 6/2018 | Park et al. | |
| 2006/0013045 A1 | 1/2006 | Lee | |
| 2006/0221695 A1 | 10/2006 | Kim | |
| 2007/0103472 A1 | 5/2007 | Kang et al. | |
| 2013/0208538 A1 | 8/2013 | Yang et al. | |
| 2015/0332743 A1* | 11/2015 | Kim ................ | G11C 16/10 711/105 |
| 2016/0071610 A1* | 3/2016 | Murakami ......... | G11C 7/222 365/185.18 |

(Continued)

*Primary Examiner* — Tan T. Nguyen
(74) *Attorney, Agent, or Firm* — Muir Patent Law, PLLC

(57) ABSTRACT

A method controls a memory device that includes a page buffer circuit comprising a plurality of page buffers each comprising at least one latch. The method includes generating by an internal voltage circuit at least one internal voltage among internal voltages used for an operation of the page buffer circuit, the internal voltage circuit providing the at least one internal voltage to the page buffer circuit; and providing to the page buffer circuit a control signal for forming an electrical connection between the internal voltage circuit and a first electrical node of a first page buffer unused for buffering in the page buffer circuit during a set operation for a first latch of a second page buffer.

20 Claims, 15 Drawing Sheets

(56) References Cited

U.S. PATENT DOCUMENTS

| | | | |
|---|---|---|---|
| 2016/0093388 A1 | 3/2016 | Song et al. | |
| 2016/0099064 A1* | 4/2016 | Shirota | G11C 16/3445 365/185.17 |
| 2017/0228189 A1* | 8/2017 | Sudo | G06F 3/0638 |
| 2018/0053568 A1* | 2/2018 | Yamauchi | G06F 12/0246 |
| 2018/0061464 A1* | 3/2018 | Yamauchi | G11C 29/52 |
| 2018/0061496 A1* | 3/2018 | Senoo | G11C 7/04 |
| 2018/0137920 A1 | 5/2018 | Song et al. | |
| 2019/0371413 A1* | 12/2019 | Okabe | G11C 16/0483 |
| 2020/0372958 A1* | 11/2020 | Kasai | G06F 11/1068 |

* cited by examiner

MEMORY DEVICE FOR STABILIZING INTERNAL VOLTAGE AND METHOD OF STABILIZING INTERNAL VOLTAGE OF THE SAME

CROSS-REFERENCE TO RELATED APPLICATION

This application claims the benefit of priority to Korean Patent Application No. 10-2019-0039740, filed on Apr. 4, 2019, in the Korean Intellectual Property Office, the disclosure of which is incorporated herein in its entirety by reference.

BACKGROUND

The inventive concept relates to a memory device and a method of stabilizing an internal voltage of the same, and more particularly, to a memory device for stabilizing an internal voltage generated by an internal voltage circuit and a method of stabilizing the internal voltage of the memory device.

Semiconductor memory devices are classified into volatile memory devices in which data stored therein is lost when a power supply is turned off and non-volatile memory devices in which data stored therein is not lost even when a power supply is turned off. Volatile memory devices are faster in reading and writing, but when an external power supply is turned off, content stored therein disappears. On the other hand, although nonvolatile memory devices are slower in reading and writing than volatile memory devices, content stored therein is preserved even when the external power supply is turned off.

As an operating speed of the semiconductor memory device increases, noise is generated in an internal voltage used in a high speed operation of the semiconductor memory device. The noise is called power noise. Various methods of reducing the power noise in the high speed operation have been discussed.

SUMMARY

Various aspects of the inventive concept provide a memory device and a method of stabilizing an internal voltage without additional capacitors, and more particularly, a memory device and a method of stabilizing the internal voltage in a high speed operation.

According to some embodiments, a method controls a memory device that includes a page buffer circuit comprising a plurality of page buffers each comprising at least one latch. The method includes generating by an internal voltage circuit at least one internal voltage among internal voltages used for an operation of the page buffer circuit, the internal voltage circuit providing the at least one internal voltage to the page buffer circuit; and providing to the page buffer circuit a control signal for forming an electrical connection between the internal voltage circuit and a first electrical node of a first page buffer unused for buffering in the page buffer circuit during a set operation for a first latch of a second page buffer.

According to some embodiments, a method of stabilizing an internal voltage of a memory device includes: before a latch set operation for a first latch included in a first page buffer of a page buffer circuit in the memory device is initiated, electrically connecting a first electrical node of a second page buffer of the page buffer circuit, the first electrical node floated in the page buffer circuit during the latch set operation, to an internal voltage circuit configured to provide an internal voltage to the page buffer circuit; initiating the latch set operation for the first latch; and disconnecting the electrical connection between the first electrical node and the internal voltage circuit after the first latch has been set.

According to some embodiments method for a memory device comprising a first memory region and a second memory region is described. The memory device includes: a first core circuit comprising an internal voltage circuit configured to generate an internal voltage required by a first page buffer circuit corresponding to a first memory region, the first core circuit being configured to control the first memory region; and a second core circuit configured to control the second memory region. The method includes generating a control signal for forming an electrical connection between the internal voltage circuit and a first electrical node included in a second page buffer circuit in the second core circuit during a set operation for a cache latch included in the first page buffer circuit.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings.

Figure 1:
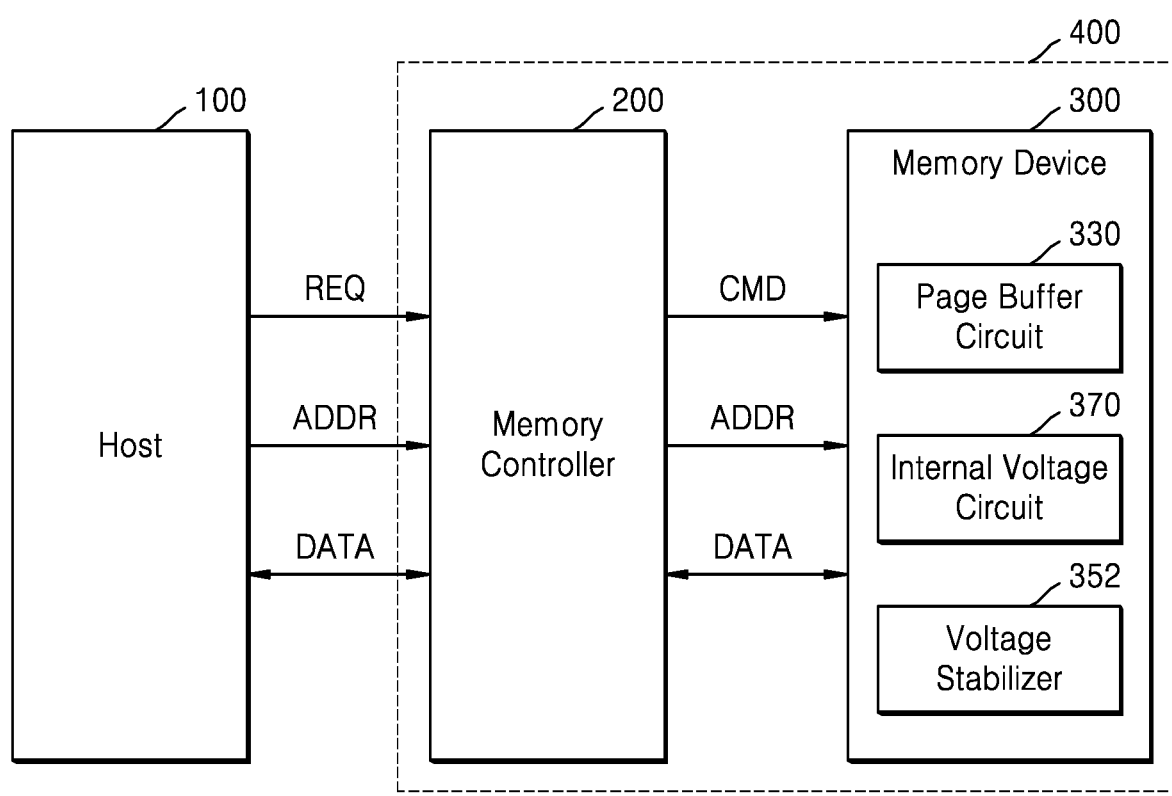
FIG. 1 illustrates a data processing system according to an example embodiment of the inventive concept.

FIG. 1 illustrates a data processing system 10 according to an example embodiment of the inventive concept. The data processing system 10 may include a host 100 and a memory system 400, and the memory system 400 may include a memory controller 200 and a memory device 300. The data processing system 10 may be applicable to one of various devices such as an ultra mobile personal computer (PC) (UMPC), a workstation, a netbook, a personal digital assistant (PDA), a portable computer, a web tablet, a wireless phone, a mobile phone, a smart phone, an e-book, a portable multimedia player (PMP), a portable game machine, a navigation device, a black box, and a digital camera.

Each of the host 100, the memory controller 200, and the memory device 300 may be provided as one chip, one package, one module, etc. However, the embodiments are not limited thereto. For example, the memory controller 200 with the memory device 300 may be provided as a memory system 400 or as a storage device.

In addition, the memory system 400 may constitute a PC card, a compact flash card (CF), a smart media card (SM/SMC), a memory stick, a multimedia card (for example, MMC, reduced-size (RS) (RS-MMC), and MMCmicro), an SD card (for example, an SD card, a miniSD card, and a microSD card), a universal flash memory device (for example, universal flash storage (UFS)), etc. As another example, the memory system 400 may constitute a solid state disk/drive (SSD).

The host 100 may send a data operation request REQ and an address ADDR to the memory controller 200 and exchange data DATA with the memory controller 200. As illustrated, the host 100 may exchange the data DATA with the memory controller 200 based on at least one of various interface protocols such as universal serial bus (USB) protocol, MMC protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, integrated drive electronics (IDE) protocol, mobile industry processor interface (MIPI) protocol, and universal flash storage (UFS) protocol.

The memory controller 200 may control the memory device 300. For example, the memory controller 200 may, in response to the data operation request REQ received from the host 100, read the data DATA stored in the memory device 300, or may control the memory device 300 to write the data DATA. For example, the memory controller 200 may control a write operation, a read operation, and an erase operation of the memory device 300 by providing the address ADDR, a command CMD, and a control signal to the memory device 300. In addition, the data DATA for the above operations may be transceived between the memory controller 200 and the memory device 300.

The memory device 300 may include at least one memory cell array. The memory cell array may include a plurality of memory cells in regions where a plurality of word lines and a plurality of bit lines cross each other, and the plurality of memory cells may include nonvolatile memory cells. Each memory cell may be a multi-level cell (MLC) storing data of two bits or more. For example, each memory cell may be a 2-bit MLC storing data of 2 bits, a triple-level cell (TLC) storing data of 3 bits, a quadruple-level cell (QLC) storing data of 4 bits, or an MLC storing data of 5 bits or more. However, the inventive concept is not limited thereto, and for example, some memory cells may be single-level cells (SLCs) storing data of one bit, while the other memory cells may be MLCs. The memory device 300 may include a NAND flash memory, a vertical NAND (VNAND) flash memory, a NOR flash memory, resistive random access memory (RAM) (RRAM), phase-change RAM (RRAM), magnetoresistive random access memory (MRAM), ferroelectric random access memory (FRAM), spin transfer random access memory (STT-RAM), or combinations thereof. The memory device 300 may perform the write, read, and erase operations of the data DATA in response to signals received from the memory controller 200.

The memory device 300 may include a page buffer circuit 330, an internal voltage circuit 370, and a voltage stabilizer 352.

The page buffer circuit 330 may be connected to the memory cell array via bit lines. The page buffer circuit 330 may be connected to a data line by selecting the bit line through a decoded column address and may perform operations to write the data DATA to or read the data DATA from the memory cell array. To this end, the page buffer circuit 330 may include a plurality of page buffers respectively connected to each of the plurality of bit lines. Therefore, as used herein, a page buffer circuit refers to the plurality of page buffers connecting between bit lines and memory cells, and each page buffer refers to an individual buffer connected to an individual bit line (or to a bit line/bit line bar pair).

The internal voltage circuit 370 may generate various internal voltages required in the memory device 300 and provide the generated internal voltages to various components in the memory device 300. For example, the internal voltage circuit 370 may generate and provide a drive voltage required to drive a transistor in the memory device 300 to the transistor in the memory device 300. In addition, for example, the internal voltage circuit 370 may generate the internal voltage needed by the page buffer circuit 330 and may provide the generated internal voltage to the page buffer circuit 330. In addition, the internal voltage circuit 370 may include one or more power circuits of various types for generating the above internal voltage. The power circuits may include one or more of various types of AC-DC converters, DC-DC converters, and AC-AC converters.

In general, it may be preferred that the particular internal voltage generated by the internal voltage circuit 370 has a particular level, for example, that the internal voltage has a stabilized value. However, when the memory device 300 is operating at a high speed, a level of the internal voltage may be different from the particular level desired due to problems such as a load effect; for example, the internal voltage may have an unstable value. Thus, the internal voltage generated by the internal voltage circuit 370 may have noise. Hereinafter, the noise is referred to as power noise. The memory device 300, in general, may use additional capacitors connected to the internal voltage circuit 370 to reduce power noise from occurring. However, the additional capacitors are typically a problem in that they incur costs and increase an area.

The voltage stabilizer 352 according to an example embodiment of the inventive concept may, when the memory device 300 operates at a high speed, electrically connect an electrical node that is not being used at the high speed operation to the internal voltage circuit 370. For example, an electric node that is not typically used during high speed operation (e.g., because the high speed operation is for a different page buffer including a different electric node) may be used during the high speed operation as a substantial capacitor.

In one embodiment, the voltage stabilizer 352 may electrically connect an electrical node that is not typically used for a latch set operation to the internal voltage circuit 370 during a set operation for a latch included in the page buffer circuit 330. For example, the voltage stabilizer 352 may, during the latch set operation, generate a control signal to electrically connect a sense-out node of a page buffer included in the page buffer circuit 330 to the internal voltage circuit 370 and may provide the generated control signal to the page buffer circuit 330. In particular, the voltage stabilizer 352 may, after a latch set preparation operation is initiated and before the latch set operation is initiated, electrically connect the sense-out node to the internal voltage circuit 370. For example, a plurality of latches may be included in a page buffer circuit 330, and in some embodiments, when a first latch for a first page buffer is being set, for example, for a memory access operation, a node connected to a second latch for a second page buffer that is not being set may be used as a capacitor (e.g., by connecting the node to internal voltage circuit 370).

In this manner, a function of a node referred to as a sense-out node should not be construed as limited to a "sense-out" function described in the name of the sense-out node, because in some cases, this node is not used for sense-out, but is used, for example, as part of a capacitor (e.g., it serves as an equivalent capacitor) when another node is being used for sensing-out. Therefore, in the present specification, the "sense-out node" may be referred to as an electrical node between the bit line and a latch such as a sensing latch and may not necessarily perform the "sense-out" function as a function of the "sense-out node".

In one embodiment, the voltage stabilizer 352 may connect electrically to the internal voltage circuit 370 a verify signal node corresponding to a verify signal line that is used to verify data pass/fail by being connected to the sensing latches in the page buffer circuit 330. In particular, the voltage stabilizer 352 may, after a latch set preparation operation is initiated and before the latch set operation is initiated (and before the latch set operation is completed), connect electrically the verify signal node to the internal voltage circuit 370. For example, the latch set preparation operation may initiate by certain charges beginning to accumulate on different nodes or lines. The charges then continue until the latch is set, at which point, the latch set operation is completed.

In this manner, according to the data processing system 10 according to an example embodiment of the inventive concept, the memory device 300 may use an electrical node associated with a first latch of a first page buffer, which is not typically used in the latch set operation of a different, second page buffer, as a capacitor, by electrically connecting the electrical node to the internal voltage circuit 370 before the set operation of a second latch included in the page buffer circuit 330 is completed. Thus, the internal voltage generated by the internal voltage circuit 370 may be stabilized without an additional capacitor. Particularly, the internal voltage may be stabilized during the latch set operation at a high speed. Further, it may be possible to reduce the power noise of the internal voltage, which can occur in the high speed operation.

Figure 2:
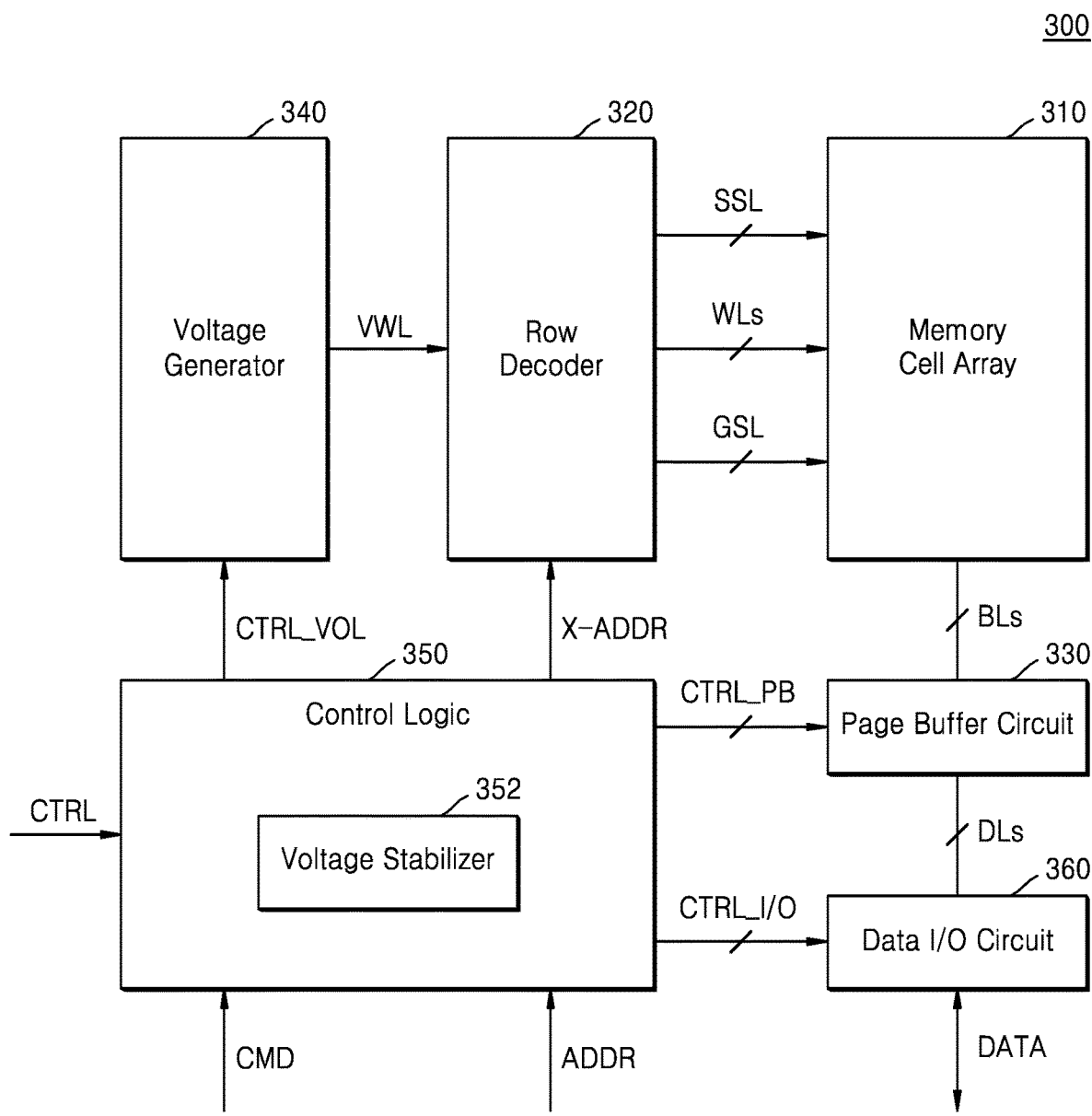
FIG. 2 illustrates a memory device according to an example embodiment of the inventive concept.

FIG. 2 illustrates the memory device 300 according to an example embodiment of the inventive concept. Descriptions of the memory device 300, which were previously given with reference to FIG. 1, are omitted.

The memory device 300 may include a memory cell array 310, a row decoder 320, the page buffer circuit 330, a voltage generator 340, a control logic 350, and a data input/output (I/O) circuit 360.

The memory cell array 310 may include a plurality of memory blocks. Each of the memory blocks may include a plurality of memory cells. The memory cell array 310 may be connected to the row decoder 320 via word lines WL, string select lines SSL, and ground select lines GSL and may be connected to the page buffer circuit 330 via bit lines BL. The memory cell array 310 may include strings respectively connected to the bit lines BLs. Here, each of the strings may include at least one string select transistor connected in series between the bit line BL and a common source line CSL, the plurality of memory cells, and at least one ground select transistor.

The row decoder 320 may select some word lines WL based on a row address X-ADDR. The row decoder 320 may transfer a word line apply voltage to the word line WL. For example, in the data write operation, the row decoder 320 may apply a program voltage and a verify voltage to a selected word line WL and a program inhibit voltage to an unselected word line WL. In the data read operation, the row decoder 320 may apply a read voltage to the selected word line WL and a read inhibit voltage to the unselected word line WL. In the data erase operation, the row decoder 320 may apply a word line erase voltage to the word line WL. In addition, the row decoder 320 may select some of the string select lines SSL or some of the ground select lines GSL based on the row address X-ADDR.

The page buffer circuit 330 may write data into the memory cell array 310 or read data from the memory cell array 310 in response to a page buffer control signal CTRL_PB received from the control logic 350.

The voltage generator 340 may generate various kinds of voltages to perform the write, read, and erase operations on the memory cell array 310 based on a voltage control signal CTRL_VOL received from the control logic 350. For example, the voltage generator 340 may generate a word line drive voltage VWL to drive the word lines WL. In this case, the word line drive voltage VWL may include a write voltage, a read voltage, a word line erase voltage, a write verify voltage, etc. In addition, the voltage generator 340 may further generate a string select line driving voltage to drive the string select lines SSL and a ground select line driving voltage to drive the ground select lines GSL. Further, in some embodiments, the internal voltage circuit 370 described with reference to FIG. 1 may be a component included in the voltage generator 340. However, the embodiments are not limited thereto, and the internal voltage circuit 370 and the voltage generator 340 may be implemented as separate components.

The control logic 350 may generate various internal control signals to store the data DATA in the memory cell array 310 or read the data DATA from the memory cell array 310 based on the command CMD, the address ADDR, and the control signal CTRL received from the memory controller 200. For example, the control logic 350 may control all operations of the memory device 300. Various internal control signals generated in the control logic 350 may be provided to the row decoder 320, the page buffer circuit 330, the voltage generator 340, etc. For example, the control logic 350 may provide the row address X-ADDR to the row decoder 320, the page buffer control signal CTRL_PB to the page buffer circuit 330, the voltage control signal CTRL- _VOL to the voltage generator 340, and a data I/O control signal CTRL_I/O to the data I/O circuit 360. However, the types of the control signals are not limited thereto, and the control logic 350 may provide other internal control signals. For example, the control logic 350 may provide a column address to a column decoder.

The data I/O circuit 360 may be connected to the page buffer circuit 330 via data lines DL and may provide the data DATA provided by the memory controller 200 to the page buffer circuit 330 or output the data DATA provided by the page buffer circuit 330 to the outside.

According to an example embodiment of the inventive concept, as described with reference to FIG. 1, the voltage stabilizer 352 may stabilize the internal voltage by electrically connecting certain electrical nodes (e.g., a floating node), which is not used to control latching in a latch set operation, to the internal voltage circuit during the set operation of a latch included in the page buffer circuit 330. For example, the voltage stabilizer 352 may connect a sense-out node in a page buffer included in the page buffer circuit 330 to the internal voltage circuit, or may connect a verify signal node included in the page buffer circuit 330 to the internal voltage circuit.

In this case, the voltage stabilizer 352 may be implemented in various forms in the memory device 300. According to an embodiment, the voltage stabilizer 352 may be implemented as hardware or software. For example, when the voltage stabilizer 352 is implemented as hardware, the voltage stabilizer 352 may include circuits for performing a control operation to electrically connect the electrical node, which is not used in a particular latch set operation, to the internal voltage circuit. In addition, for example, when the voltage stabilizer 352 is implemented as software, the voltage stabilizer 352 may perform the control operation by executing a program (or instructions) stored in the memory device 300 by using at least one processor in the control logic 350 or the memory device 300. However, the embodiments are not limited thereto, and the voltage stabilizer 352 may be implemented as a combination of software and hardware. FIG. 2 illustrates an embodiment in which the voltage stabilizer 352 is implemented as software executed by the control logic 350, but the technical idea of the inventive concept is not limited thereto.

According to the memory device 300 according to an example embodiment of the inventive concept, the memory device 300 may use an electrical node that is not used to control latching in a particular latch set operation as a capacitor, by electrically connecting the internal voltage circuit to the electrical node before the set operation of the particular latch included in the page buffer circuit 330 is completed. Thus, the internal voltage generated by the internal voltage circuit 370 may be stabilized without an additional capacitor. Particularly, the internal voltage may be stabilized in the latch set operation at a high speed. Therefore, it may be possible to reduce the power noise of the internal voltage, which can occur in the high speed operation.

Figure 3A:
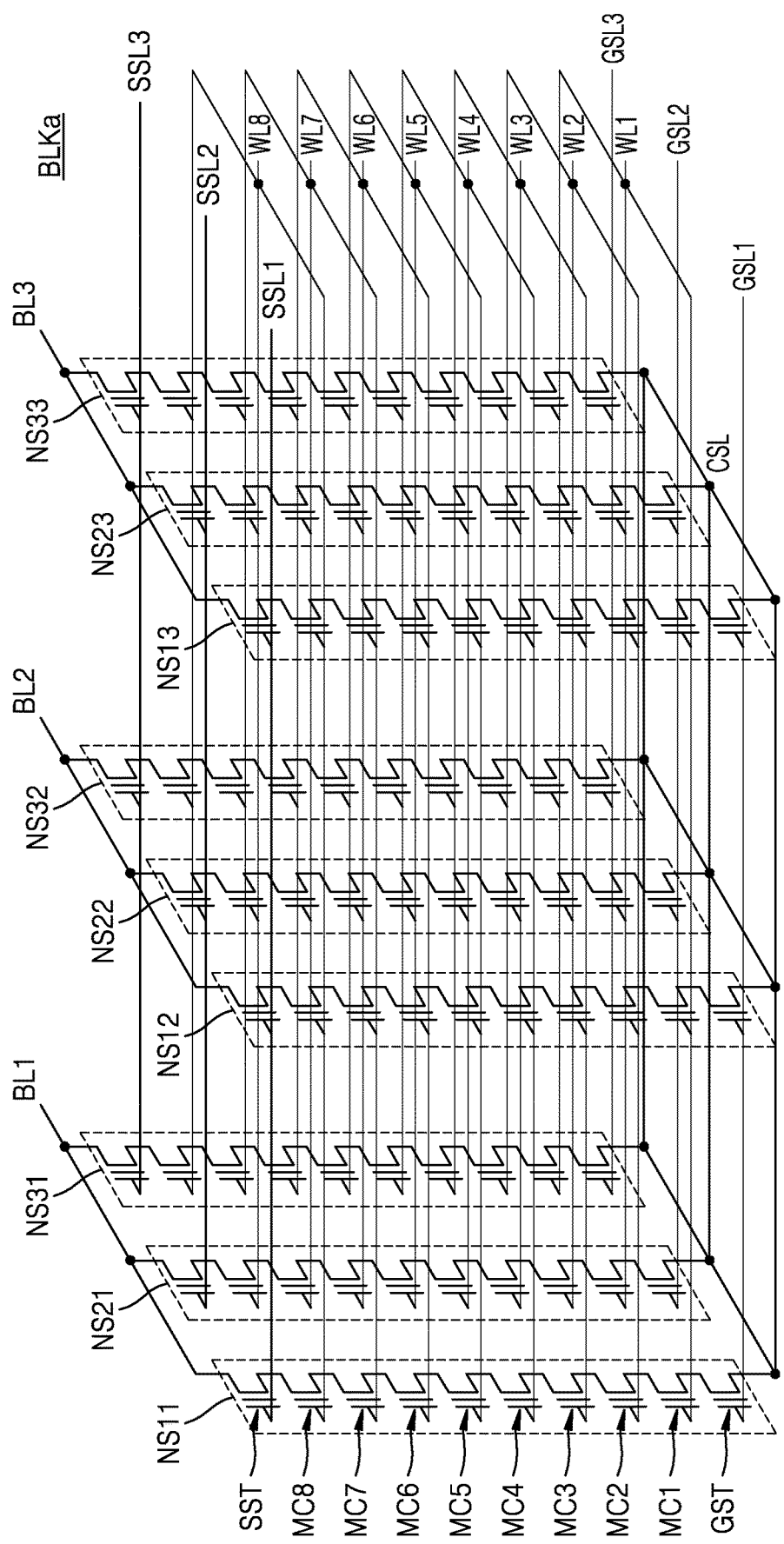
FIGS. 3A and 3B each illustrate a structure of a memory block, according to example embodiments of the inventive concept.
Figure 3B:
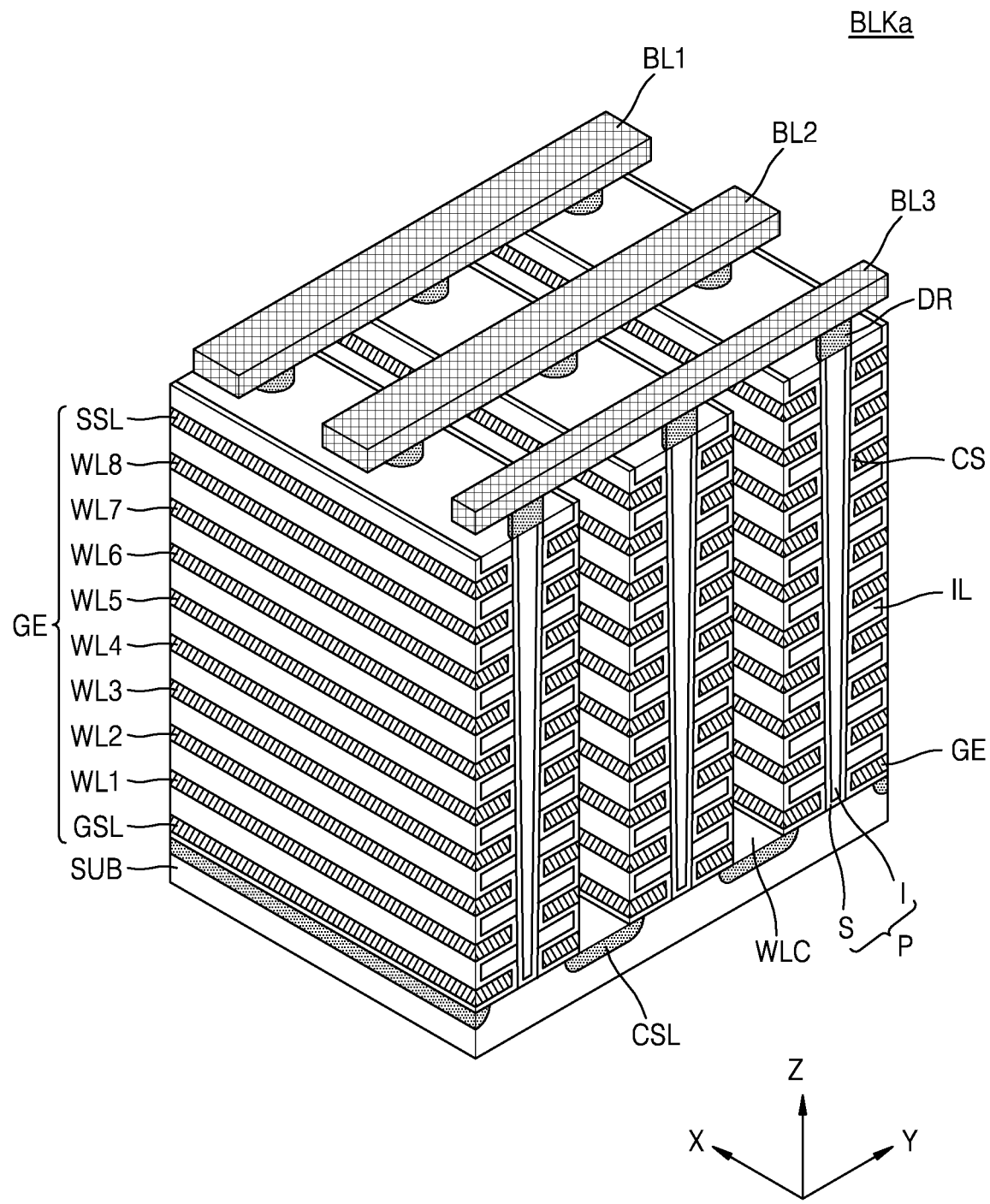

FIGS. 3A and 3B each illustrate a structure of a memory block BLKa, according to example embodiments of the inventive concept; Each of the plurality of memory blocks included in the memory cell array 310 in FIG. 2 may have the structure of the memory block BLKa illustrated in FIG. 3A and/or FIG. 3B.

Referring to FIG. 3A, the memory block BLKa may include a plurality of NAND strings (NS11-NS33), a plurality of ground select lines GLS1 through GSL3, a plurality of string select lines SSL1 through SSL3, and a common source line CSL. Here, the number of NAND strings, the number of word lines WL, the number of bit lines BL, the number of ground select lines GSL, and the number of string select lines SSL may be variously changed according to an embodiment.

The NAND strings (NS11, NS21, and NS31) may be between the first bit line BL1 and the common source line CSL, the NAND strings (N512, NS22, and NS32) may be between the second bit line BL2 and the common source line CSL, and the NAND strings (N513, NS23, and NS33) may be between the third bit line BL3 and the common source line CSL. Each NAND string (for example, NS11) may include a string select transistor SST, a plurality of memory cells MC, and the ground select transistor GST, which are connected to each other in series.

The string select transistor SST may be connected to a corresponding string select line (SSL1 through SSL3). The plurality of memory cells MC may be connected to corresponding word lines (WL1 through WL8), respectively. The ground select transistor GST may be connected to each of corresponding ground select lines (GSL1 through GSL3). The string select transistor SST may be connected to a corresponding string bit line (BL1 through BL3), and the ground select transistor GST may be connected to the ground select line GSL.

In FIG. 3A, each string is shown as including one string selection transistor SST, but the embodiments are not limited thereto, and each string may include a top string select transistor and a bottom string select transistor, which are connected to each other in series. In addition, in FIG. 3B, each string is shown as including one ground select transistor GST, but the embodiments are not limited thereto, and each string may include a top ground select transistor and a bottom ground select transistor, which are connected to each other in series. In this case, the top ground select transistors may be connected to the corresponding ground select lines (GSL1 through GSL3), and the bottom ground select transistors may be commonly connected to a common ground select line.

Referring to FIG. 3B, the memory block BLKa may be formed in a direction perpendicular to a substrate SUB (or, an upper substrate), (for example, in a third direction). In FIG. 3B, the memory block BLKa is illustrated as including two select lines (GSL and SSL), eight word lines (WL1 through WL8), and three bit lines (BL1 through BL3). However, this is only for convenience of explanation, and their numbers may be more or less than the numbers thereof illustrated in FIG. 3B. In addition, in another example, the memory block BLKa may include one or more dummy lines between the first word line WL1 and the ground select line GSL, and/or between the eighth word line WL8 and the string select line SSL.

The substrate SUB may include a polysilicon layer doped with a first conductivity type (for example, p-type). The substrate SUB may include a bulk silicon substrate, a silicon on insulator (SOI) substrate, a germanium substrate, a germanium on insulator (GOI) substrate, a silicon germanium substrate, or a substrate of an epitaxial thin layer obtained by performing selective epitaxial growth (SEG). The substrate SUB may include a semiconductor material and may include at least one of, for example, silicon (Si), germanium (Ge), silicon germanium (SiGe), gallium arsenide (GaAs), indium gallium arsenide (InGaAs), aluminum gallium arsenide, or a combination thereof.

The substrate SUB may be provided with the common source line CSL extending in a second direction (e.g., the X direction) on the substrate SUB and being doped with impurities of a second conductivity type (for example, n-type). In a region of the substrate SUB between two adjacent common source lines CSL, a plurality of insulating layers IL extending in the second direction may be sequentially provided to be arranged in a third direction (e.g., the Z direction), and the plurality of insulating layers IL may be apart from each other by a certain distance in the third direction. For example, the plurality of insulating layers IL may include an insulating material such as silicon oxide.

A plurality of pillars P may be provided arranged sequentially in the second direction in the region of the substrate SUB, between two adjacent common source lines CSL and may penetrate through the plurality of insulating layers IL in the third direction. For example, the plurality of pillars P may penetrate the plurality of insulating layers IL and contact the substrate SUB. A surface layer S of each pillar P may include a silicon material of the first conductivity type and may function as a channel region. In the present specification, the pillar P may be referred to as a vertical channel structure. An inner layer I of each pillar P may include an insulating material such as silicon oxide or an air gap. In some embodiments, for example, the size of a channel hole in each pillar P may decrease toward the substrate SUB.

In the region between two adjacent common source lines CSL, a charge storage layer CS may be provided above the substrate SUB along exposed surfaces of the insulating layers IL, the pillars P, and the substrate SUB. The charge storage layer CS may include a gate insulating layer (also referred to as a tunneling insulating layer), a charge trap layer, and a blocking insulating layer. For example, the charge storage layer CS may have an oxide-nitride-oxide (ONO) structure. In addition, in a region between two adjacent common source lines CSL, a gate electrode GE including the selection lines (GSL and SSL) and the word lines (WL1 through WL8) may be provided on an exposed surface of the charge storage layer CS.

Drains or drain contacts DR may be respectively provided on the plurality of pillars P. For example, the drains or the drain contacts DR may include a silicon material doped with impurities of the second conductivity type. On the drain contacts DR, bit lines (BL1, BL2, and BL3) may be provided extending in the first direction (e.g., Y direction) and apart by a certain distance in the second direction. The bit lines (BL1, BL2, and BL3) may be electrically connected to the drain contacts DR via contact plugs (not shown).

On the common source line CSL, a word line cut region WLC extending in the second direction may be provided. The gate electrode GE may be separated by the word line cut region WLC. For example, the word line cut region WLC may include an insulating material or an air gap.

Figure 4:
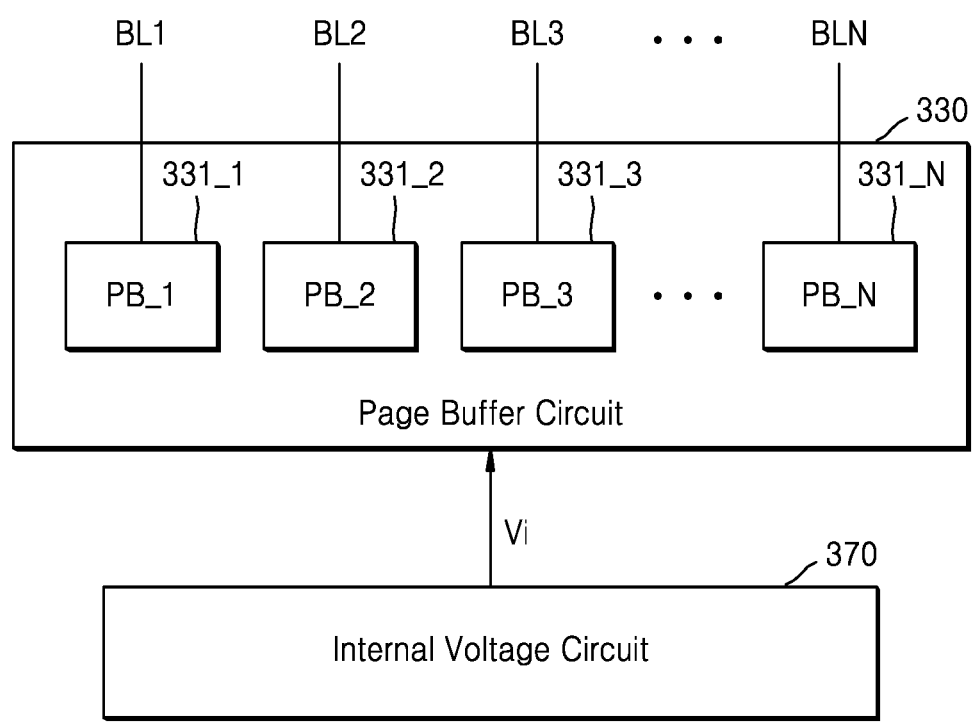
FIG. 4 illustrates a page buffer circuit and an internal voltage circuit, according to an example embodiment of the inventive concept.

FIG. 4 illustrates the page buffer circuit 330 and the internal voltage circuit 370, according to an example embodiment of the inventive concept. Descriptions previously given of the page buffer circuit 330 and the internal voltage circuit 370 with reference to FIGS. 1 and 2 are omitted from being given with reference to FIG. 4. FIG. 4 is described with reference to both FIGS. 1 and 2.

The page buffer circuit 330 may include a plurality of page buffers. For example, the page buffer circuit 330 may include a first page buffer 331_1, a second page buffer 331_2, a third page buffer 331_3, . . . , an $N^{th}$ page buffer 331_N (where N is a natural number). Each of the plurality of page buffers may be connected to a corresponding bit line BL. For example, the first page buffer 331_1 may be connected to the first bit line BL1, and similarly, the $N^{th}$ page buffer 331_N may be connected to the $N^{th}$ bit line BLN.

The internal voltage circuit 370 may generate at least one of the various internal voltages required by the memory device 300. In addition, for example, the internal voltage circuit 370 may generate an internal voltage Vi needed by the page buffer circuit 330 and may provide the generated internal voltage Vi to the page buffer circuit 330. For example, the internal voltage Vi may include a driving voltage for driving transistors included in the page buffer circuit 330.

In the data read operation of the memory device 300, each of the plurality of page buffers may sense data from the bit line BL. For sensing data, each of the plurality of page buffers may include at least one latch. For a normal operation of the latch, the memory device 300 may perform an operation of setting the latch. A voltage for driving the transistors included in the latch may also be generated by the internal voltage circuit 370. When the latch set operation is performed at a high speed, due to the load effect, etc., a change may occur in a voltage level of the internal voltage Vi generated by the internal voltage circuit 370.

The voltage stabilizer 352 according to an example embodiment of the inventive concept may prevent an above-described destabilization of the internal voltage Vi and stabilize the internal voltage Vi. For example, before the latch set operation is performed for a particular page buffer 331, the voltage stabilizer 352 may electrically connect one or more nodes unused in the latch set operation among the electrical nodes included in the page buffer circuit 330 to the internal voltage circuit 370. In this case, the node unused in the latch set operation may be a node that is floating during the latch set operation when the voltage stabilizer 352 does not perform a control operation.

Figure 5:
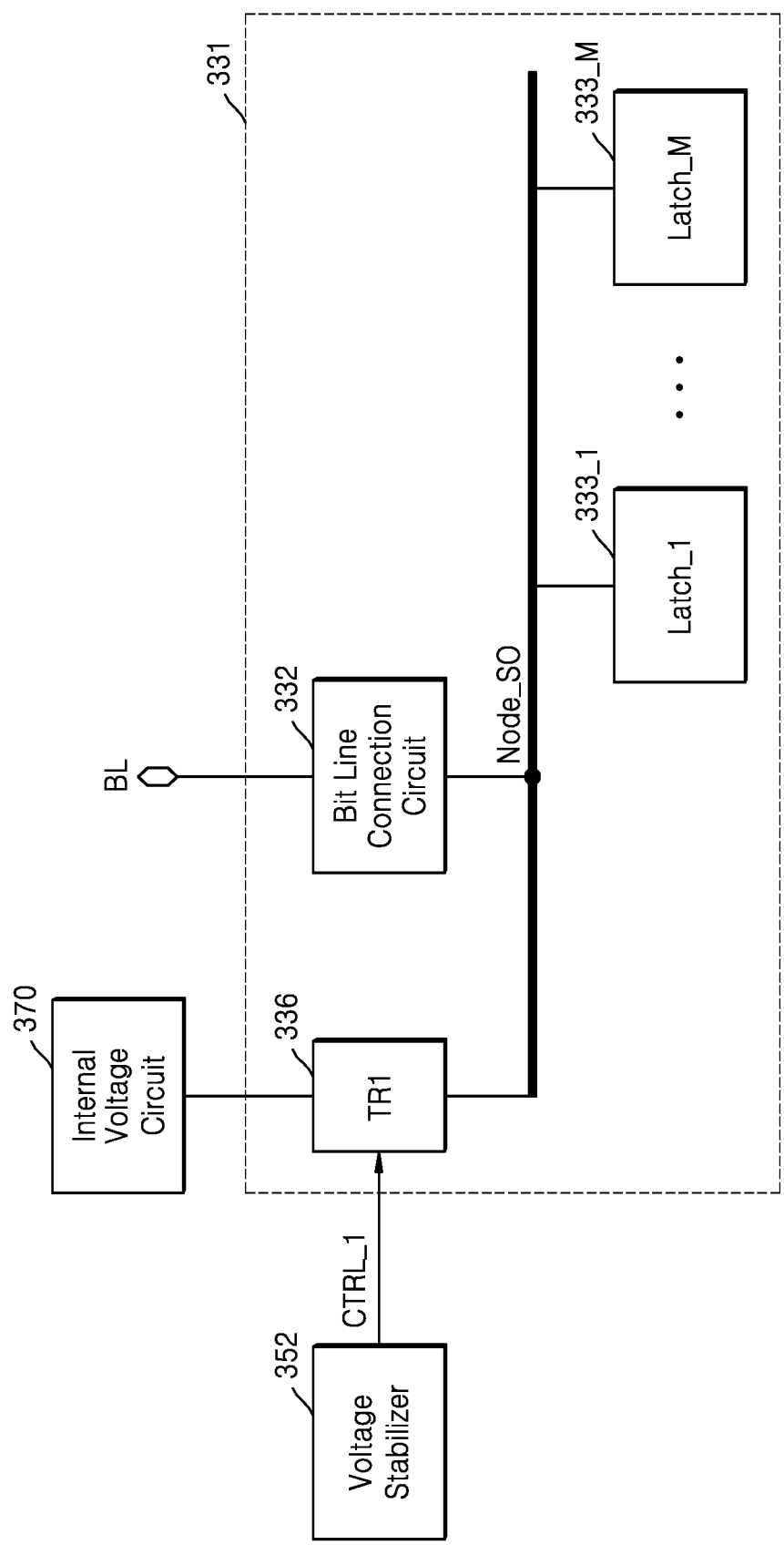
FIG. 5 illustrates a page buffer, a voltage stabilizer, and an internal voltage circuit, according to an example embodiment of the inventive concept.

FIG. 5 illustrates a page buffer 331, the voltage stabilizer 352, and the internal voltage circuit 370, according to an example embodiment of the inventive concept. The page buffer 331 in FIG. 5 may represent any of the first page buffer 331_1 through the $N^{th}$ page buffer 331_N in FIG. 4. At least some of the first page buffer 331_1 through the $N^{th}$ page buffer 331_N in FIG. 4 may have the same structure as the page buffer 331 in FIG. 5, or may operate like the page buffer 331 in FIG. 5. Descriptions previously given of the page buffer 331, the voltage stabilizer 352, and the internal voltage circuit 370 with reference to FIGS. 1 through 4 are omitted.

The page buffer 331 may include a bit line connection circuit 332, at least one latch, and a first transistor (TR1) 336. The at least one latch may include a first latch 333_1 through an $M^{th}$ latch 333_M (where M is a natural number). FIG. 5 illustrates, with respect to a configuration of the page buffer 331, only the configuration necessary for a description of an embodiment according to the inventive concept, but may actually further include various configurations used for the operation other than a basic operation of the page buffer 331. For example, the page buffer 331 may further include a precharge circuit, etc. for precharging a sense-out node Node_SO.

The bit line connection circuit 332 may selectively connect the memory cells included in the memory cell array to the sense-out node Node_SO via the bit line BL. For example, according to a logic level of the page buffer control signal provided by the control logic, the bit line connection circuit 332 may connect the bit line to the sense-out node Node_SO, or may disconnect a connection between them.

The at least one latch included in the page buffer 331 may include at least one of a sensing latch, a data latch, and a cache latch. The sensing latch may latch data sensed by the memory cell. The data latch may temporarily store the data.

The cache latch may temporarily store the data, output the stored data to the outside of the page buffer 331, or temporarily store data received from the outside of the page buffer 331. At least one latch may be connected to the sense-out node Node_SO. As described herein, for ease and clarity of description, for two items that are connected by wiring and/or circuit elements which permit transfer of signals between the two items either sometimes or at all times, these two items are referred to generally as connected, or more specifically as physically connected. Where such items are connected by a circuit element that selectively permits and prohibits signals from being transferred depending on the state of the circuit element, these items may be described as "selectively connected," or "selectively electrically connected" to each other. For two items that are selectively connected to each other, when in an electrically connected state they may be described as "actively connected," and when in an electrically disconnected state they may be described as "actively disconnected."

In a data read operation mode, the page buffer 331 may precharge the sense-out node Node_SO, develop the precharged sense-out node Node_SO by electrically connecting the precharged sense-out node Node_SO to the bit line BL (e.g., a develop operation), and sense the data by using at least one latch connected to the developed sense-out node Node_SO. In addition, the sensed data may be provided to the outside of the page buffer 331 by using the at least one latch.

FIG. 5 illustrates a case where the first latch 333_1 through the $M^{th}$ latch 333_M are always electrically connected to the sense-out node Node_SO, but the embodiments are not limited thereto. For example, like a cache latch 335 in FIG. 7, in some embodiments, at least some of the first latch 333_1 through the $M^{th}$ latch 333_M are selectively connected to the sense-out node Node_SO (e.g., through a transistor).

When the latch set operation is performed for any one of the first latch 333_1 through the $M^{th}$ latch 333_M (hereinafter, it is assumed that the first latch 333_1 corresponds to any one of the latches), the first latch 333_1 and the sense-out node Node_SO may be electrically separated and the sense-out node Node_SO may be floated. To reduce the noise of the internal voltage Vi provided by the internal voltage circuit 370 while the latch set operation is performed, the voltage stabilizer 352 may electrically connect the electrical node unused in the page buffer 331 to the internal voltage circuit 370. For example, the voltage stabilizer 352 may electrically connect the floated sense node Node_SO to the internal voltage circuit 370.

In some embodiments, after the latch set preparation operation is initiated and before the latch set operation is initiated (and before the latch set operation is completed) for one or more latches of a particular (e.g., first) page buffer, the voltage stabilizer 352 electrically connects the sense-out node Node_SO of a different (e.g., second) page buffer to the internal voltage circuit 370. After the latch set operation for the one or more latches is completed, the voltage stabilizer 352 electrically disconnects the electrical connection between the sense-out node Node_SO of the different page buffer and the internal voltage circuit 370. Therefore, during the latch set operation for the first latch 333_1, the sense-out node Node_SO is electrically connected to the internal voltage circuit 370. To form or disconnect the electrical connection between the sense-out node Node_SO and the internal voltage circuit 370, the voltage stabilizer 352 may provide a first control signal CTRL_1 to the TR1 336. In some embodiments, the first latch 333_1 may be a cache latch. In some embodiments, the TR1 336 may include a p-type metal oxide semiconductor field effect transistor (MOSFET). The voltage stabilizer 352 may turn on the TR1 336 by providing the first control signal CTRL_1 of a first level to the TR1 336 and may turn off the TR1 336 by providing the first control signal CTRL_1 of a second level to the TR1 336.

The memory device 300 according to an example embodiment of the inventive concept may reduce the power noise in the internal voltage Vi from occurring by connecting the internal voltage circuit 370 to the sense node Node_SO for a latch in an unused page buffer during a latch set operation for a first latch 333_1 in a different page buffer being set. In this manner, the memory device 300 may stabilize the internal voltage Vi. Though not shown in the figures, the sense node Node_SO can be connected, for example through TR1 336, to an output line or terminal of the internal voltage circuit 370 that supplies the internal voltage.

Figure 6:
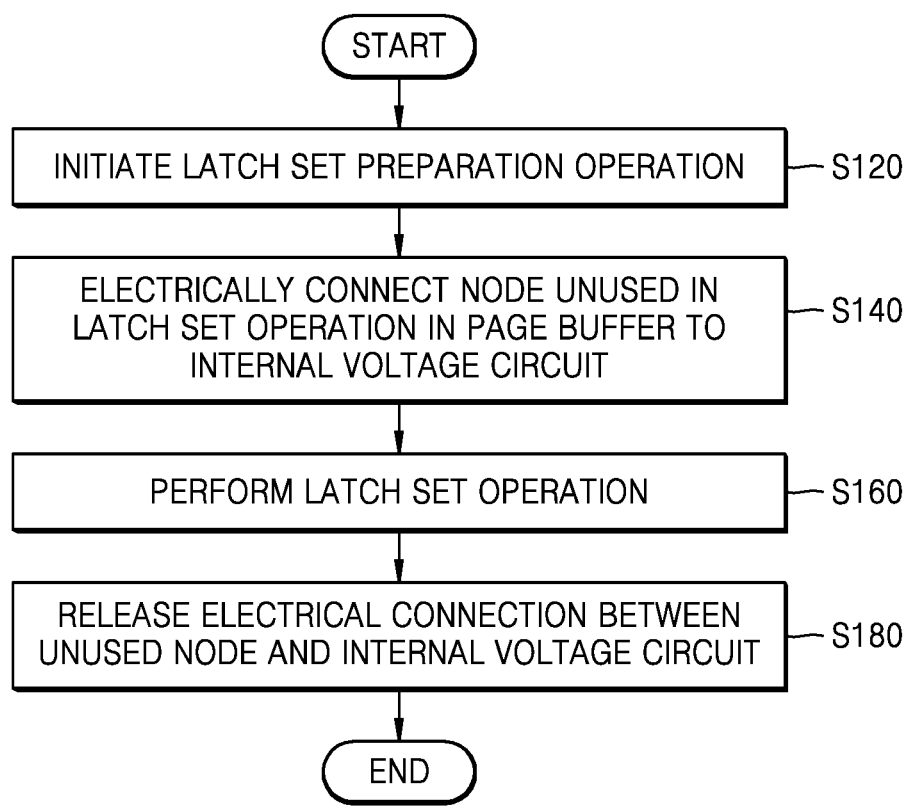
FIG. 6 illustrates a flowchart of a method of stabilizing an internal voltage of a memory device, according to an example embodiment of the inventive concept.

FIG. 6 illustrates a flowchart of a method of stabilizing the internal voltage Vi of the memory device 300, according to an example embodiment of the inventive concept. FIG. 6 is described with reference to FIGS. 1 through 5 together.

The memory device 300 may initiate the latch set preparation operation for any one of the first latch 333_1 through the $M^{th}$ latch 333_M (S120) of a particular page buffer. The latch set preparation operation may indicate an operation of preparing for the latch set operation prior to the latch set operation, as described above. In an embodiment, any one of the latches may be a cache latch.

The memory device 300 may electrically connect an electrical node not being used for the latch set operation in the particular page buffer 331 to the internal voltage circuit 370 (S140). For example, an electrical node in a different page buffer 331, such as Node_SO in FIG. 5 of a different page buffer 331, may be electrically connected to the internal voltage circuit 370. In an embodiment, the voltage stabilizer 352 may provide the first control signal CTRL_1 to the TR1 336 of the different page buffer 331 for electrically connecting an electrical node unused in the latch set operation of the particular page buffer 331 to the internal voltage circuit 370.

The memory device 300 may perform the latch set operation (S160). In an embodiment, the memory device 300 may initiate the latch set operation after an electrical node unused for setting the latch in the latch set operation (e.g., an electrical node in a different page buffer 331) is electrically connected to the internal voltage circuit 370. In an embodiment, the unused electrical node may be a sense-out node corresponding to a page buffer including a latch on which the latch set operation is not being performed (therefore, the electrical node and the different page buffer are not being used for buffering). For example, the unused electrical node may be a node connected to one or more latches of a first page buffer through one or more respective transistors, and the unused electrical node may be floating due to the one or more transistors being in an open circuit setting during the latch set operation of a particular, second page buffer. In one embodiment, the unused electrical node may be a detection signal node corresponding to a detection signal line used for data pass/fail detection in the page buffer circuit 330.

The memory device 300 may disconnect the electrical connection between the unused node and the internal voltage circuit 370 (S180). For example, in some embodiments, after the latch set operation is completed, the memory device 300 disconnect the electrical connection between the unused node and the internal voltage circuit 370 (e.g., by turning off TR1 336 in the example of FIG. 5).

Figure 7:
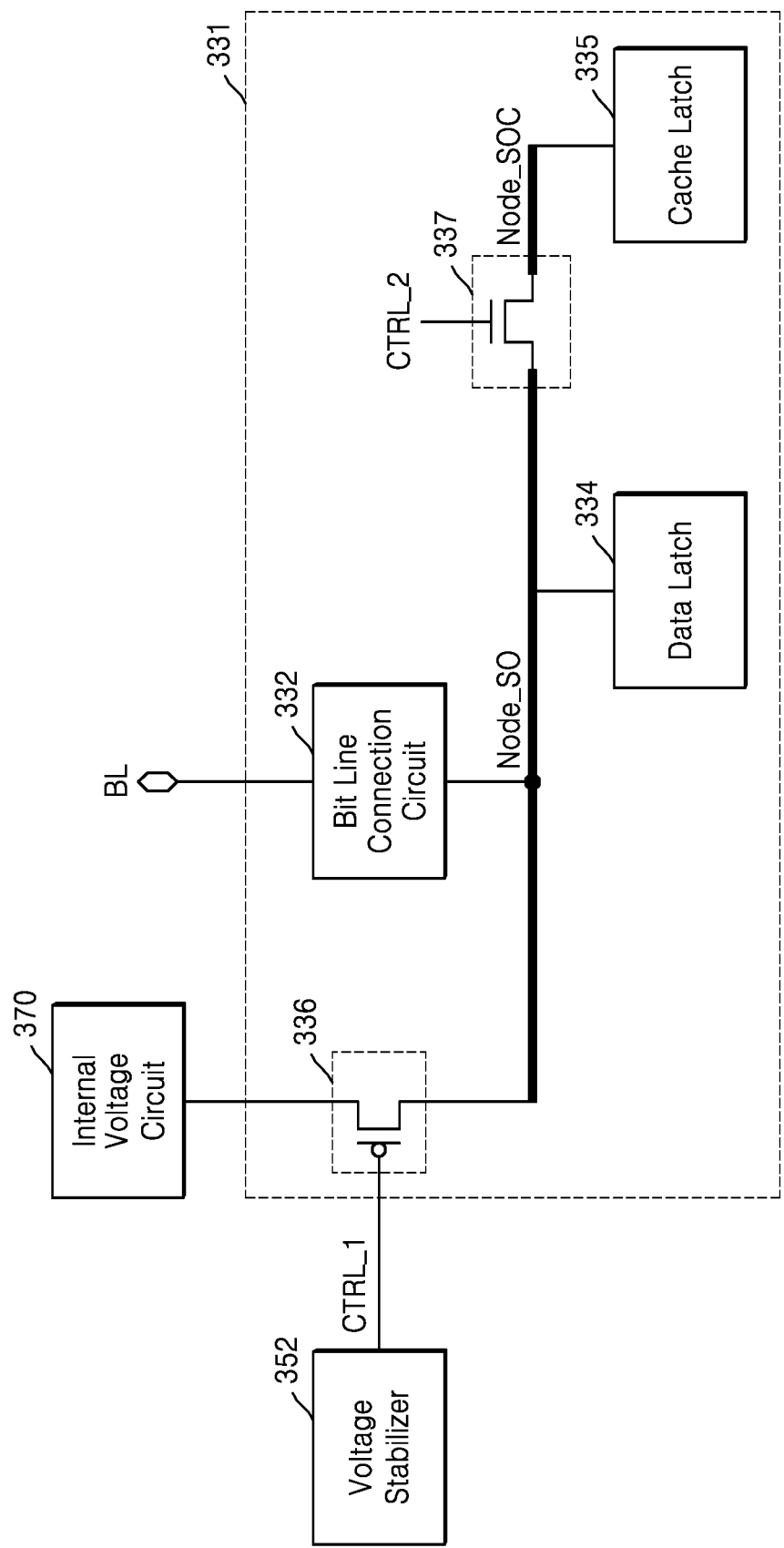
FIG. 7 illustrates a page buffer, a voltage stabilizer, and an internal voltage circuit, according to an example embodiment of the inventive concept.

FIG. 7 illustrates a page buffer 331, the voltage stabilizer 352, and the internal voltage circuit 370, according to an example embodiment of the inventive concept. FIG. 7 illustrates a more detailed embodiment than FIG. 5. FIG. 7 is described mainly in terms of the differences from FIG. 5.

Each page buffer 331 of a page buffer circuit may include a data latch 334 and a cache latch 335 and may include a second transistor (TR2) 337 connected between a sense-out node Node_SO and a sense-out cache node Node_SOC.

In the present specification, a function of a node referred to as the sense-out cache node should not be construed as limited to a "sense-out and cache"-related function based on the name of the sense-out cache node. For example, in the present specification, the "sense-out cache node" may be referred to as an electrical node connected to the cache latch and may not necessarily perform the "sense-out" function as a function of the "sense-out cache node" at certain times (e.g., it may function as part of a capacitor at some times and as a sense-out cache node at others, as discussed previously).

The data latch 334 may temporarily store the sensed data.

The TR2 337 may be connected between the sense-out node Node_SO and the sense-out cache node Node_SOC, and is used to selectively form an electrical flow between the sense-out node Node_SO and the sense-out cache node Node_SOC. A second control signal CTRL_2 may be input to a gate of the TR2 337, and in an embodiment, the second control signal CTRL_2 may be provided by a control logic. In an embodiment, in the latch set operation for the cache latch 335 of a first page buffer, the second transistor 337 of a second page buffer not being set may be turned off, to disconnect the electrical connection between the sense-out node Node_SO and the sense-out cache node Node_SOC.

The TR1 336 may include a p-type MOSFET.

In an embodiment, before the latch set operation for the cache latch 335 of the first page buffer is initiated, the voltage stabilizer 352 electrically connects the sense-out node Node_SO of a second page buffer to the internal voltage circuit 370. To this end, during the latch set preparation operation of the first page buffer, the voltage stabilizer 352 may turn on the TR1 336 of the second page buffer by providing the first control signal CTRL_1 of the first level to the TR1 336.

Thus, according to an example embodiment of the inventive concept, even when the latch set operation for the cache latch 335 of a first page buffer is performed at a high speed, the internal voltage Vi may be stabilized by utilizing the floated sense node Node_SO of a second page buffer as a substantial capacitor.

Figure 8:
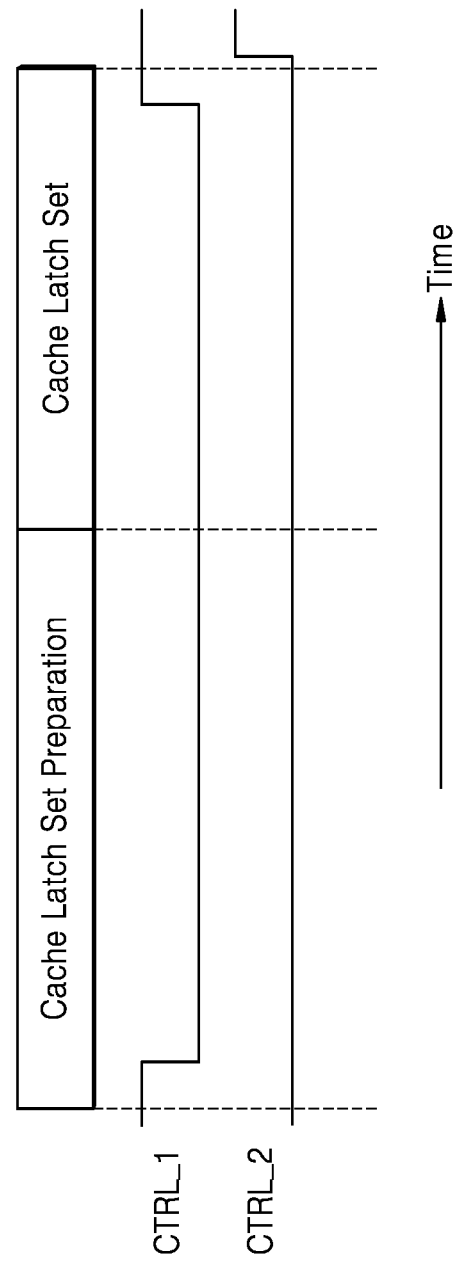
FIG. 8 illustrates a timing chart of a method of stabilizing an internal voltage of a memory device, according to an example embodiment of the inventive concept.

FIG. 8 illustrates a timing chart of a method of stabilizing the internal voltage Vi of the memory device 300, according to an example embodiment of the inventive concept. FIG. 8 is described with reference to FIG. 7.

The latch set operation for the cache latch 335 of a first page buffer of the memory device 300 may include a cache latch set preparation interval and a cache latch set interval.

Before the cache latch set preparation interval starts, the voltage stabilizer 352 may turn off the TR1 336 of the second page buffer by providing the first control signal CTRL_1 of the second level to the TR1 336. In addition, the second control signal CTRL_2 provided to the TR_2 337 may have a third level for turning off the second transistor 337. In this case, the third level may have a level similar to the first level of the first control signal CTRL_1 provided to the TR1 336.

After the cache latch set preparation interval starts, the voltage stabilizer 352 turns on the TR1 336 of the second page buffer by providing the first control signal CTRL_1 of the first level to the TR1 336.

After the cache latch set preparation interval has ended, the cache latch set interval starts.

After the cache latch set operation for the first page buffer is completed in the cache latch set interval, the voltage stabilizer 352 turns off the TR1 336 of the second page buffer again by changing the level of the first control signal CTRL_1 from the first level to the second level. Here, FIG. 8 illustrates that a time point at which the TR1 336 is turned off is included in the cache latch set interval, but the embodiments are not limited thereto, and the TR1 336 may be turned off even after the cache latch set interval has ended.

Figure 9:
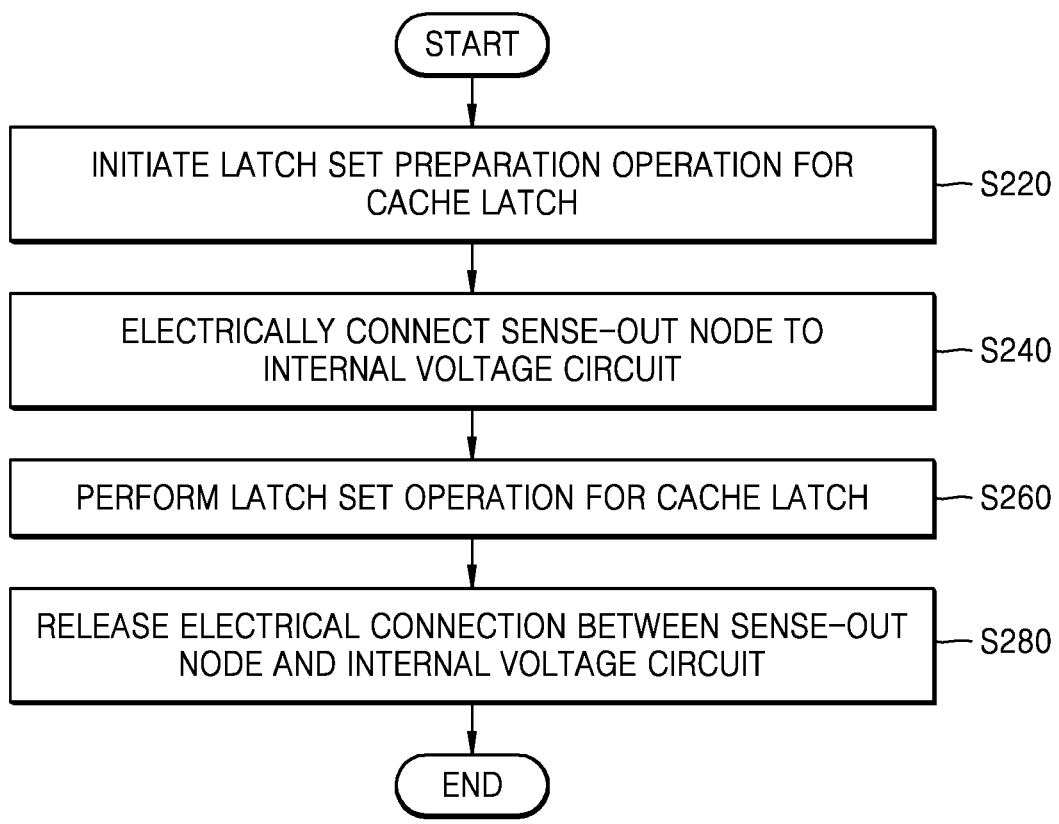
FIG. 9 illustrates a flowchart of a method of stabilizing an internal voltage of a memory device, according to an example embodiment of the inventive concept.

FIG. 9 illustrates a flowchart of a method of stabilizing the internal voltage Vi of the memory device 300, according to an example embodiment of the inventive concept. FIG. 9 illustrates a flowchart of the method of stabilizing the internal voltage Vi corresponding to the embodiment with reference to FIG. 7 as a more detailed embodiment of FIG. 6. FIG. 9 is described with reference to FIG. 7.

The memory device 300 initiates the latch set preparation operation for the cache latch 335 (S220) of a first page buffer. The latch set preparation operation may indicate an operation of preparing for the latch set operation prior to the latch set operation.

The memory device 300 electrically connects the sense-out node Node_SO of a second page buffer to the internal voltage circuit 370 (S240). In an embodiment, the voltage stabilizer 352 provides the first control signal CTRL_1 of the first level to the TR1 336 of the second page buffer for electrically connecting the sense-out node Node_SO of the second page buffer to the internal voltage circuit 370.

The memory device 300 performs the latch set operation for the cache latch 335 of the first page buffer (S260). In an embodiment, the memory device 300 may initiate the latch set operation for the cache latch 335 of the first page buffer after the sense node Node_SO of the second page buffer is electrically connected to the internal voltage circuit 370.

The memory device 300 then disconnects the electrical connection between the sense-out node Node_SO of the second page buffer and the internal voltage circuit 370 (S280). In an embodiment, after the latch set operation has ended, the memory device 300 disconnects the electrical connection between the unused node of the second page buffer and the internal voltage circuit 370.

Figure 10:
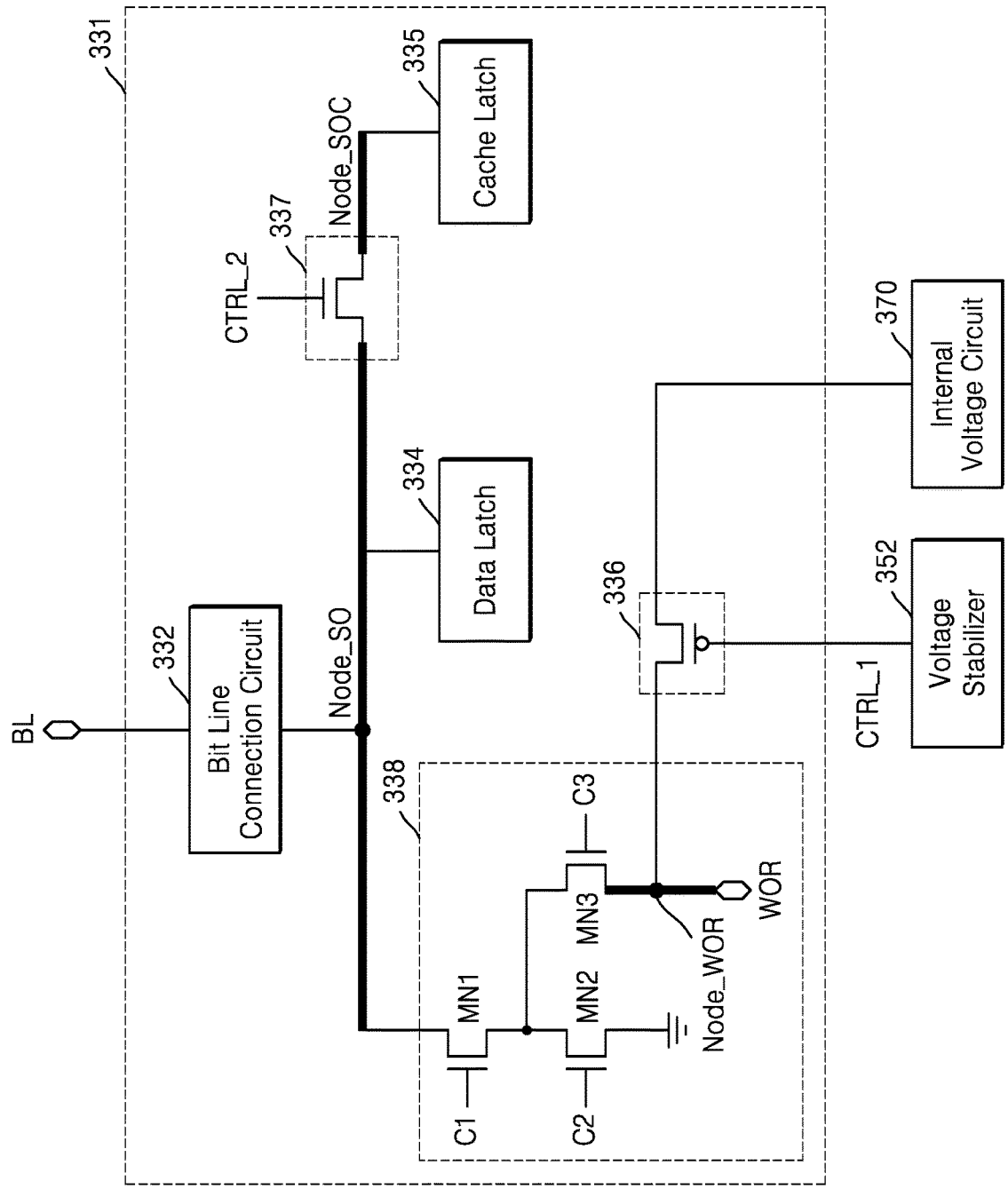
FIG. 10 illustrates a page buffer, a voltage stabilizer, and an internal voltage circuit, according to an example embodiment of the inventive concept.

FIG. 10 illustrates a page buffer 331, the voltage stabilizer 352, and the internal voltage circuit 370, according to an example embodiment of the inventive concept. FIG. 10 is described mainly with reference to differences from FIG. 5.

Each page buffer 331 of a page buffer circuit may include the data latch 334, the cache latch 335, and the TR2 337. The TR2 337 may be connected between the sense-out node Node_SO and the sense-out cache node Node_SOC, and form or disconnect an electrical flow between the sense-out node Node_SO and the sense-out cache node Node_SOC. The TR2 337 may be controlled by the second control signal CTRL_2, and the second control signal CTRL_2 may be provided by the control logic. For example, in the latch set operation for the cache latch of a first page buffer, the TR2 337 of a second page buffer may be turned off based on the second control signal CTRL_2, and may disconnect a connection between the sense node Node_SO of the second page buffer and the sense cache node Node_SOC.

Each page buffer 331 may further include a sensing latch 338. The sensing latch 338 may include a first n-type transistor MN1 controlled by a first sensing control signal C1, a second n-type transistor MN2 controlled by a second sensing control signal C2, and a third n-type transistor MN3 controlled by a sensing control signal C3. The sensing latch 338 may be connected to a verify signal line WOR for detecting the pass/fail of data.

The TR1 336 may be connected between a verify signal node Node_WOR corresponding to the verify signal line WOR and the internal voltage circuit 370. The TR1 336 may selectively provide an electrical connection between the verify signal node Node_WOR and the internal voltage circuit 370 based on the first control signal CTRL_1. The first control signal CTRL_1 may be provided by the voltage stabilizer 352. In an embodiment, the TR1 336 may include a p-type MOSFET.

In an embodiment, the verify signal line WOR of a second page buffer may not be used in the latch set operation for the cache latch 335 of a first page buffer. Accordingly, during the latch set operation for the cache latch 335 of the first page buffer, the voltage stabilizer 352 may electrically connect the verify signal node Node_WOR of the second page buffer and the internal voltage circuit 370. Thus, the verify signal node Node_WOR may be used like a substantial capacitor. In an embodiment, after the latch set preparation operation for the cache latch 335 is initiated, and before the latch set operation is initiated, the voltage stabilizer 352 may electrically connect the verify signal node Node_WOR to the internal voltage circuit 370. After the latch set operation for the first latch 333_1 is completed, the voltage stabilizer 352 may disconnect the electrical connection between the verify signal node Node_WOR and the internal voltage circuit 370.

Figure 11:
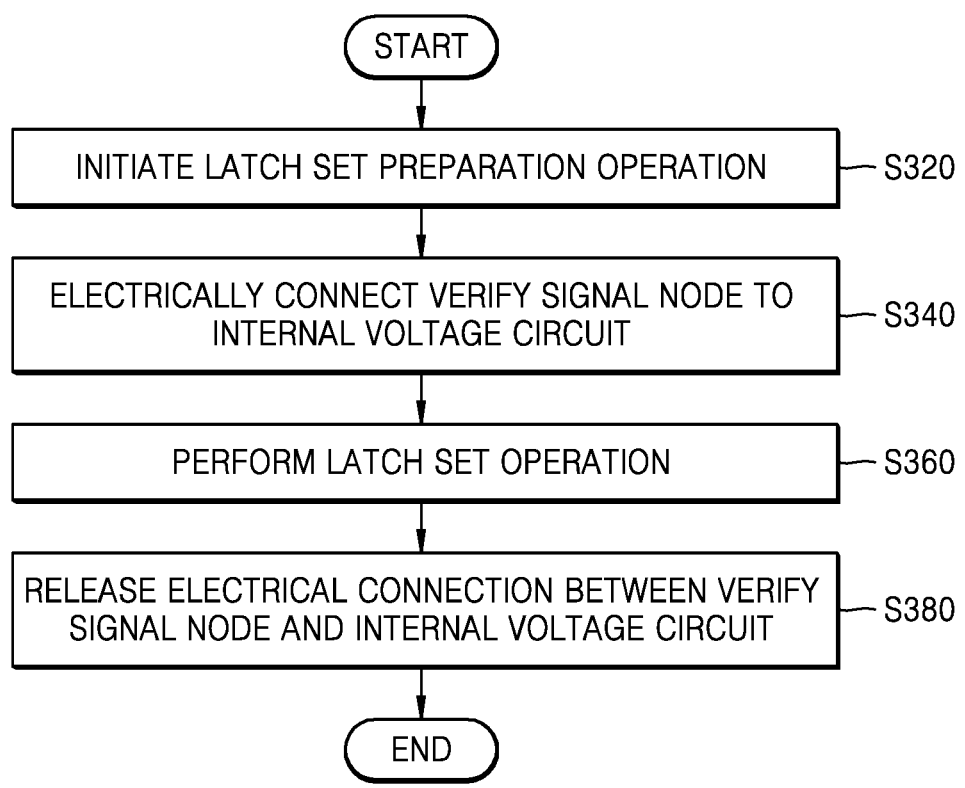
FIG. 11 illustrates a flowchart of a method of stabilizing an internal voltage of a memory device, according to an example embodiment of the inventive concept.

FIG. 11 illustrates a flowchart of a method of stabilizing the internal voltage Vi of the memory device 300, according to an example embodiment of the inventive concept. FIG. 11 illustrates a flowchart of the method of stabilizing the internal voltage Vi corresponding to the embodiment with reference to FIG. 10 as a more detailed embodiment of FIG. 6. FIG. 11 is described with reference to FIG. 10.

The memory device 300 initiates the latch set preparation operation for the cache latch 335 (S320) of a first page buffer. The latch set preparation operation may indicate an operation of preparing for the latch set operation prior to the latch set operation.

The memory device 300 electrically connects the verify signal node Node_WOR of a second page buffer to the internal voltage circuit 370 (S340). In an embodiment, the voltage stabilizer 352 may provide the first control signal CTRL_1 of the first level to the TR1 336 for electrically connecting the verify signal node Node_WOR of the second page buffer to the internal voltage circuit 370.

The memory device 300 then performs the latch set operation for the cache latch 335 (S360) of the first page buffer. In an embodiment, the memory device 300 may initiate the latch set operation for the cache latch 335 of the first page buffer after the verify signal node Node_WOR of the second page buffer is electrically connected to the internal voltage circuit 370.

The memory device 300 then disconnects the electrical connection between the verify signal node_Node WOR of the second page buffer and the internal voltage circuit 370 (S380). In an embodiment, after the latch set operation has ended, the memory device 300 disconnect the electrical connection between the verify signal node Node_WOR of the second page buffer and the internal voltage circuit 370.

Figure 12:
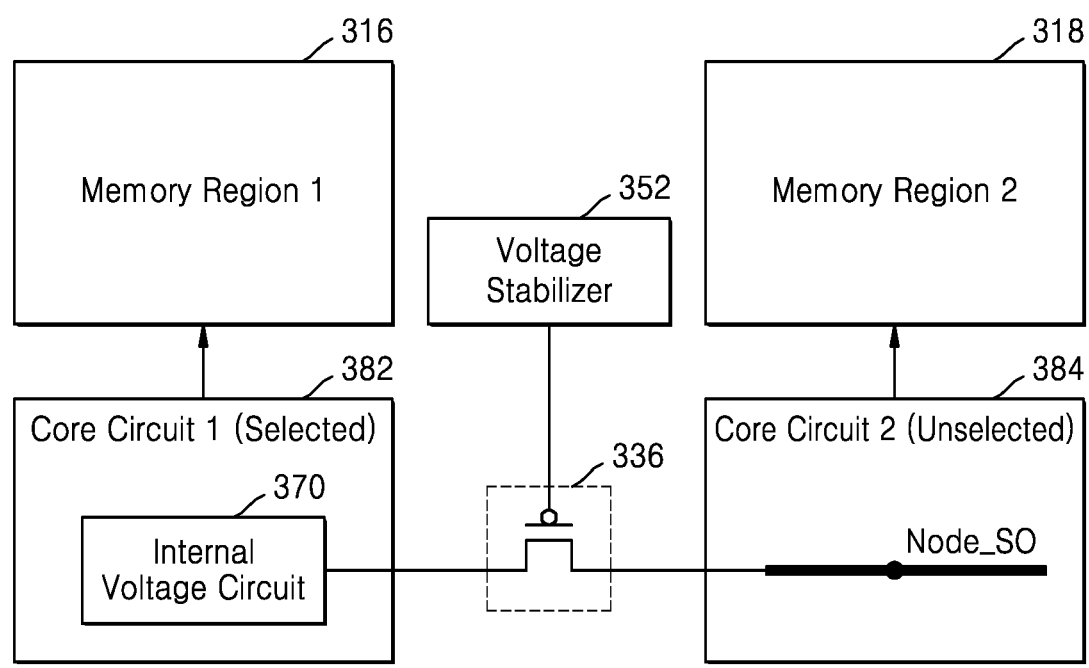
FIG. 12 illustrates a memory device according to an example embodiment of the inventive concept.

FIG. 12 illustrates a memory device 300 according to an example embodiment of the inventive concept. FIG. 12 illustrates a memory device 300 in a particular case where the memory device 300 has a plane independent core (PIC) structure.

The memory device 300 may include a first memory region 316, a second memory region 318, a first core circuit 382, and a second core circuit 384.

The first memory region 316 and the second memory region 318 may represent memory regions included in the memory cell array 310 in FIG. 2. In an embodiment, each of the first memory region 316 and the second memory region 318 may represent a different memory mat (MAT).

The first core circuit 382 may include peripheral circuits for controlling the first memory region 316, and the second core circuit 384 may include peripheral circuits for controlling the second memory region 318. For example, the first core circuit 382 may include a first page buffer circuit connected to the bit lines BL of the first memory region 316, and the second core circuit 384 may include a second page buffer circuit connected to the bit lines BL of the second memory region 318.

A case is described in which, in the memory device 300, an operation of setting the cache latch 335 included in the first core circuit 382 for controlling the first memory region 316 is performed. Accordingly, it may be said that the first memory region 316 and the first core circuit 382 have been selected, and the second memory region 318 and the second core circuit 384 have been unselected.

During an operation of setting the cache latch included in the first core circuit 382, the voltage stabilizer 352 may electrically connect the internal voltage circuit 370 included in the first core circuit 382 to the sense-out node Node_SO included in a plurality of page buffers in a second page buffer circuit included in the second core circuit 384. The voltage stabilizer 352 may turn on the TR1 336 by providing a control signal to the TR1, for electrically connecting the internal voltage circuit of the first core circuit 382 to the sense-out node Node_SO of the second core circuit 384. The TR1 336 may include a p-type MOSFET.

According to the memory device 300 according to an example embodiment of the inventive concept, in a memory device 300 including a plurality of memory mats, by connecting a sense-out node in a core circuit corresponding to an unselected memory region to an internal voltage circuit in a core circuit corresponding to a selected memory region, the sense-out node in the core circuit corresponding to the unselected memory region may be utilized as a substantial capacitor. Thus, the memory device 300 may reduce power noise that may occur in a fast cache latch set operation.

Figure 13:
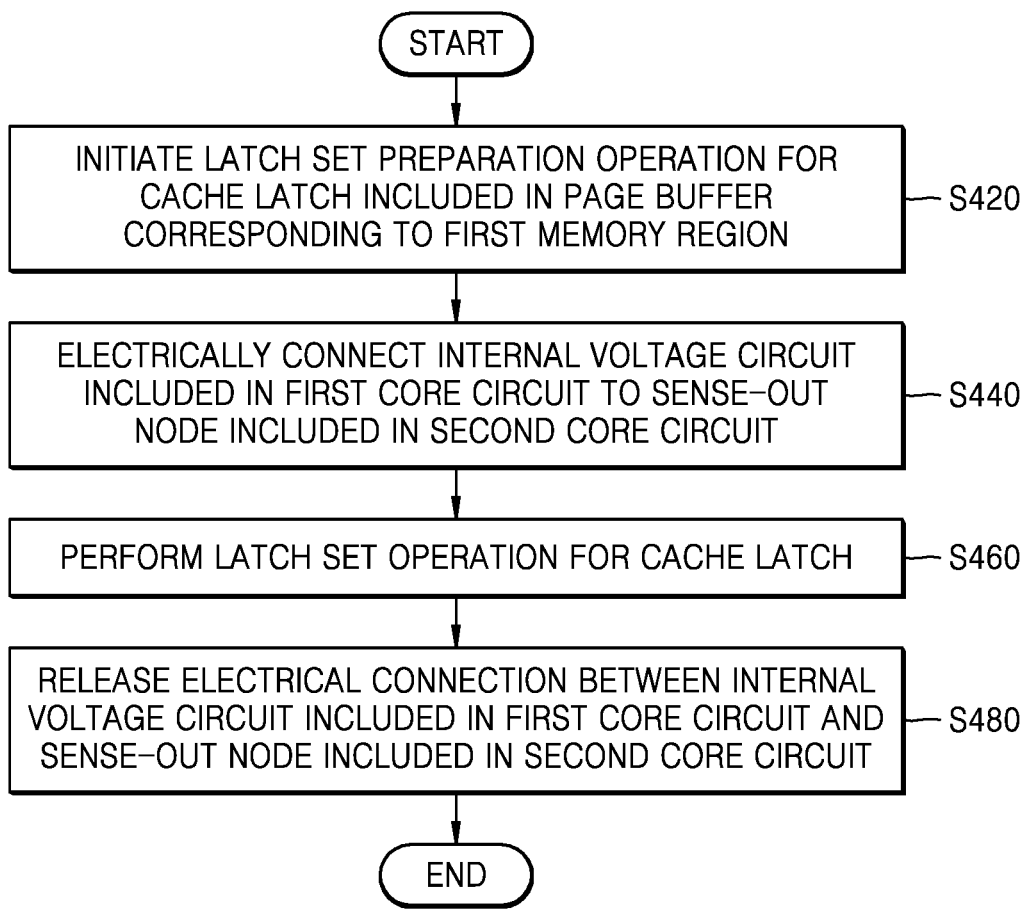
FIG. 13 illustrates a flowchart of a method of stabilizing an internal voltage of a memory device, according to an example embodiment of the inventive concept.
Figure 14:
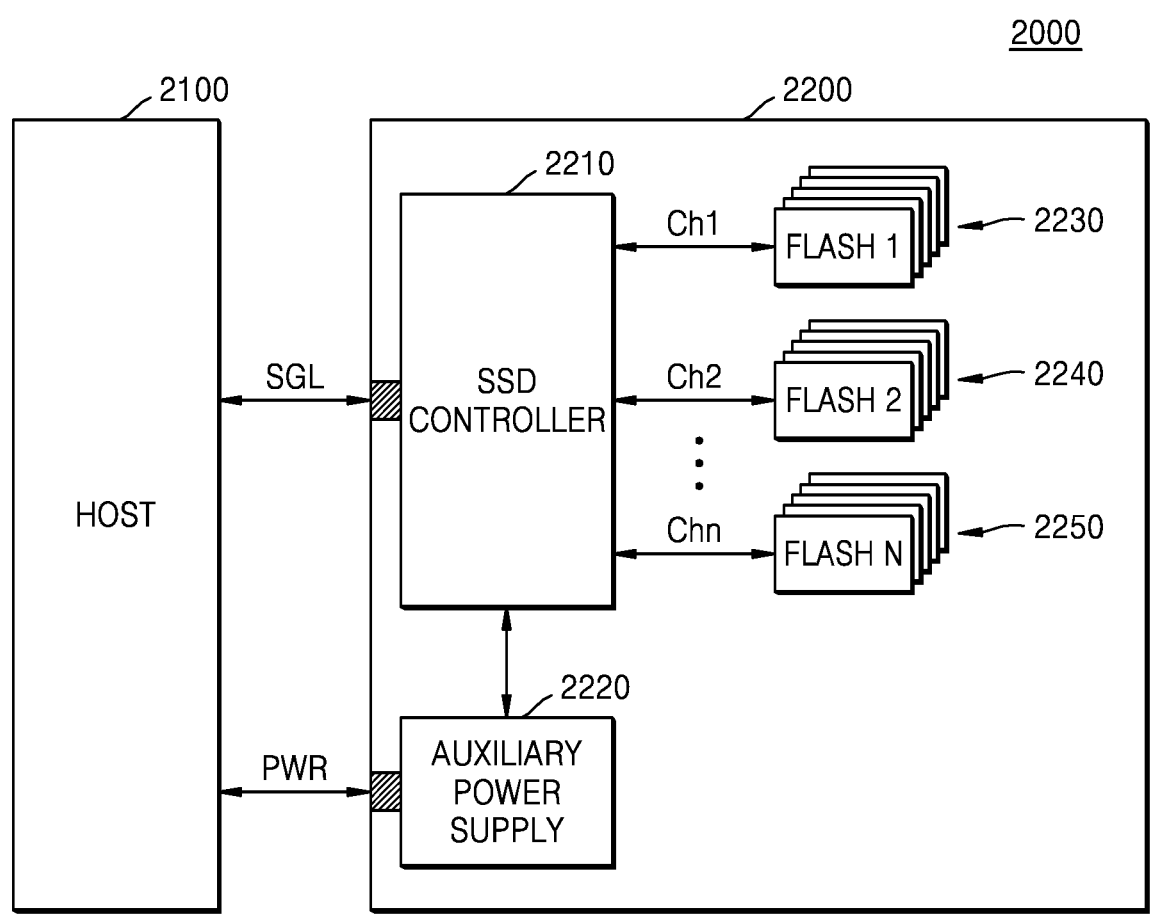
FIG. 14 illustrates a solid state drive (SSD) system according to an example embodiment of the inventive concept.

FIG. 13 illustrates a flowchart of a method of stabilizing the internal voltage Vi of the memory device 300, according to an example embodiment of the inventive concept. FIG. 13 is described with reference to FIG. 12.

The memory device 300 initiates the latch set preparation operation for the cache latch included in the page buffer in the first core circuit 382 corresponding to the first memory region 316 (S420).

The memory device 300 electrically connects the internal voltage circuit 370 included in the first core circuit 382 to the sense-out node Node_SO included in the second core circuit 384 (S440). In an embodiment, after the latch set preparation operation is initiated and before the latch set operation is initiated, the voltage stabilizer 352 electrically connects the internal voltage circuit 370 to the sense-out node Node_SO.

The memory device 300 performs the latch set operation for the cache latch 335 included in the first core circuit 382 (S460).

The memory device 300 disconnects the electrical connection between the sense-out node Node_SO included in the first core circuit 382 and the internal voltage circuit 370 included in the second core circuit 384 (S480). In an embodiment, after the latch set operation has ended, the memory device 300 disconnects the electrical connection between the sense-out node Node_SO and the internal voltage circuit 370.

FIG. 19 illustrates a solid-state drive (SSD) system 1000 according to an example embodiment of the inventive concept. The SSD system 1000 may include a host 1100 and an SSD 1200. The SSD 1200 may exchange signals with the host 1100 via a signal connector and may receive power via a power connector. The SSD 1200 may include an SSD controller 1110, an auxiliary power supply 1220, and a plurality of flash memory devices (1230, 1240, and 1250). Here, the SSD 1200 may be implemented by using the embodiments illustrated in FIGS. 1 through 13.

According to the embodiments illustrated in FIGS. 1 through 13, each of the flash memory devices (1230, 1240, and 1250) may include a voltage stabilizer. Accordingly, each of the flash memory devices (1230, 1240, and 1250) may stabilize an internal voltage by electrically connecting an electrical node that is otherwise not used in a cache latch set operation to an internal voltage circuit, and thus, may reduce power noise.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

While the inventive concept has been particularly shown and described with reference to embodiments thereof, it will be understood that various changes in form and details may be made therein without departing from the spirit and scope of the following claims.

What is claimed is:

1. A method of controlling a memory device that includes a page buffer circuit comprising a plurality of page buffers each comprising at least one latch, the method comprising:
generating by an internal voltage circuit at least one internal voltage among internal voltages used for an operation of the page buffer circuit, the internal voltage circuit providing the at least one internal voltage to the page buffer circuit; and
providing to the page buffer circuit a control signal for forming an electrical connection between the internal voltage circuit and a first electrical node of a first page buffer unused for buffering in the page buffer circuit during a set operation for a first latch of a second page buffer.

2. The method of claim 1, further comprising:
generating the control signal for an electrical connection of the first electrical node of the first page buffer to the internal voltage circuit during a cache latch set preparation interval for the first latch.

3. The method of claim 1, further comprising:
generating the control signal for disconnecting the electrical connection between the first electrical node of the first page buffer and the internal voltage circuit after the first latch has been set.

4. The method of claim 1, wherein:
the first latch includes:
a cache latch configured to temporarily store data in a data read operation mode of the memory device.

5. The method of claim 1, wherein:
each of the plurality of page buffers is configured to:
sense data through a develop operation of each sense-out node in a data read operation mode of the memory device, and
the first electrical node includes:
a first sense-out node corresponding to the page buffer comprising the first latch.

6. The method of claim 5, wherein:
each of the plurality of page buffers further comprises:
a first transistor, which when turned on, provides an electrical path between each sense-out node and the internal voltage circuit, and further comprising:
providing to the first transistor of the first page buffer a control signal for turning on the first transistor during the set operation for the first latch of the second page buffer.

7. The method of claim 6, wherein:
the first transistor comprises:
a p-type metal oxide semiconductor field effect transistor (MOSFET).

8. The method of claim 1, wherein:
the page buffer circuit comprises:
a verify signal line configured to transfer a signal for verifying a pass/fail of data sensed by the plurality of page buffers, and
the first electrical node includes:
a verify signal node corresponding to the verify signal line.

9. The method of claim 8, wherein
the verify signal node includes:
an electrical node connected to an n-type metal oxide semiconductor (MOS) transistor in a sensing latch included in the plurality of page buffers.

10. The method of claim 9, wherein
the page buffer circuit further comprises:
a first transistor, which when turned on, provides an electrical path between the verify signal node and the internal voltage circuit, and further comprising:
providing to the first transistor a control signal for turning on the first transistor during the set operation for the first latch.

11. A method of stabilizing an internal voltage of a memory device,
the method comprising:
before a latch set operation for a first latch included in a first page buffer of a page buffer circuit in the memory device is initiated, electrically connecting a first electrical node of a second page buffer of the page buffer circuit, the first electrical node floated in the page buffer circuit during the latch set operation, to an internal voltage circuit configured to provide an internal voltage to the page buffer circuit;
initiating the latch set operation for the first latch; and
disconnecting the electrical connection between the first electrical node and the internal voltage circuit after the first latch has been set.

12. The method of claim 11, wherein:
the electrically connecting of the first electrical node to the internal voltage circuit comprises:
initiating a latch set preparation operation for the first latch; and electrically connecting, after the latch set preparation operation is initiated, the first electrical node to the internal voltage circuit.

13. The method of claim 11, wherein:
the memory device comprises:
a first transistor, which when turned on, provides an electrical connection between the first electrical node and the internal voltage circuit,
the electrically connecting of the first electrical node to the internal voltage circuit comprises:
turning on the first transistor by providing a control signal of a first logic level to the first transistor, and
the disconnecting of the electrical connection between the first electrical node and the internal voltage circuit comprises:
turning off the first transistor by providing a control signal of a second logic level to the first transistor.

14. The method of claim 11, wherein:
the electrically connecting of the first electrical node to the internal voltage circuit comprises:
increasing capacitance of an equivalent capacitor connected to the internal voltage circuit by electrically connecting the first electrical node to the internal voltage circuit.

15. The method of claim 11, wherein:
the first electrical node includes:
a sense-out node corresponding to a page buffer comprising the first latch.

16. The method of claim 11, wherein:
the page buffer circuit comprises:
a verify signal line configured to transfer a signal for verifying a pass/fail of sensed data, and
the first electrical node includes:
a verify signal node corresponding to the verify signal line.

17. A method for a memory device comprising a first memory region and a second memory region
the memory device comprising:
a first core circuit comprising an internal voltage circuit configured to generate an internal voltage required by a first page buffer circuit corresponding to a first memory region, the first core circuit being configured to control the first memory region; and
a second core circuit configured to control the second memory region; and
the method comprising:
generating a control signal for forming an electrical connection between the internal voltage circuit and a first electrical node included in a second page buffer circuit in the second core circuit during a set operation for a cache latch included in the first page buffer circuit.

18. The method of claim 17, further comprising:
generating a control signal for electrically connecting the first electrical node to the internal voltage circuit during a set preparation operation interval for the cache latch.

19. The method of claim 17, wherein
the memory device comprises a plurality of memory mats,
the first memory region is a memory mat selected among the plurality of memory mats, and
the second memory region is an unselected memory mat among the plurality of memory mats.

20. The method of claim 17, wherein:
the first electrical node comprises:
at least one of a sense-out node corresponding to a plurality of page buffers included in the second page buffer circuit and a verify signal node corresponding to a verify signal line for detecting data sensed by the second page buffer circuit.

* * * * *